United States Patent
Chambers et al.

[11] Patent Number: 6,124,180
[45] Date of Patent: *Sep. 26, 2000

[54] BICMOS PROCESS FOR COUNTER DOPED COLLECTOR

[75] Inventors: Stephen T. Chambers; Richard G. Taylor, both of Portland, Oreg.

[73] Assignee: Intel Corporation, Santa Clara, Calif.

[ * ] Notice: This patent is subject to a terminal disclaimer.

[21] Appl. No.: 08/066,618

[22] Filed: May 24, 1993

Related U.S. Application Data

[63] Continuation of application No. 07/881,309, May 7, 1992, abandoned, which is a continuation of application No. 07/690,103, Apr. 23, 1991, abandoned.

[51] Int. Cl.[7] .................................................. H01L 21/331
[52] U.S. Cl. ............................ 438/350; 438/202; 438/364; 438/365; 438/369; 438/564; 148/DIG. 9; 148/DIG. 10; 148/DIG. 11
[58] Field of Search ........................................ 438/202, 309, 438/350, 364, 365, 369, 564, FOR 161, FOR 165; 148/DIG. 9, DIG. 10, DIG. 11

[56] References Cited

U.S. PATENT DOCUMENTS

| | | | |
|---|---|---|---|
| 4,066,473 | 1/1978 | O'Brien | 437/31 |
| 4,283,236 | 8/1981 | Sizsi | 437/32 |
| 4,431,460 | 2/1984 | Barson et al. | 437/31 |
| 4,484,388 | 11/1984 | Iwasaki . | |
| 4,602,269 | 7/1986 | Koike . | |
| 4,740,478 | 4/1988 | Zdebel et al. | 437/27 |
| 4,803,175 | 2/1989 | Alvarez et al. . | |
| 4,927,776 | 5/1990 | Soejima . | |
| 4,933,295 | 6/1990 | Feist . | |
| 4,956,305 | 9/1990 | Arndt | 437/31 |
| 4,957,874 | 9/1990 | Soejima . | |
| 4,962,053 | 10/1990 | Spratt et al. | 437/31 |
| 4,965,216 | 10/1990 | Scovell et al. . | |
| 4,993,295 | 2/1991 | Feist . | |
| 5,006,476 | 4/1991 | De Jong et al. | 148/DIG. 9 |
| 5,011,784 | 4/1991 | Ratnakumar | 437/34 |
| 5,095,355 | 3/1992 | Shiomi et al. | 357/54 |
| 5,101,257 | 3/1992 | Hayden et al. | 357/34 |
| 5,107,321 | 4/1992 | Ilderem et al. | 357/34 |
| 5,227,657 | 7/1993 | Denham | 257/491 |

FOREIGN PATENT DOCUMENTS 1-93167  4/1989  Japan .

*Primary Examiner*—Peter Toby Brown
*Assistant Examiner*—Long Pham
*Attorney, Agent, or Firm*—Blakely, Sokoloff, Taylor & Zafman LLP

[57] ABSTRACT

A BiCMOS process where a base region is formed in a relatively highly doped n-type substrate region. Boron is implanted at two different energy levels to form the base region and a counter doped n region near the base collector junction to prevent impact ionization.

9 Claims, 3 Drawing Sheets

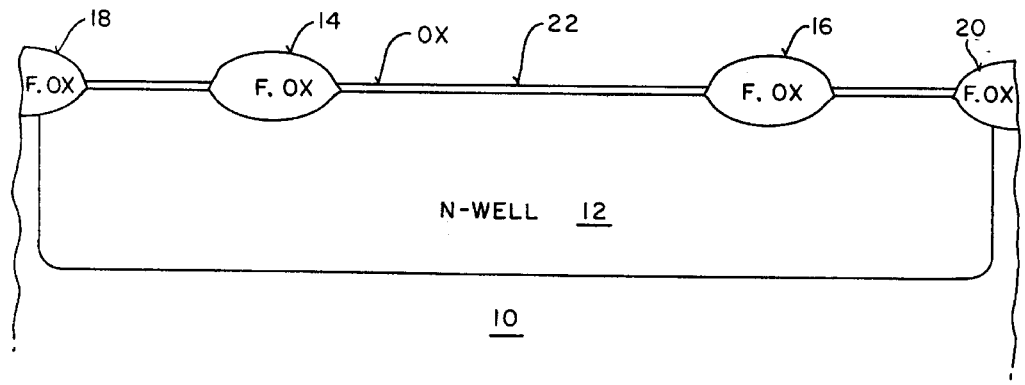
FIG_1
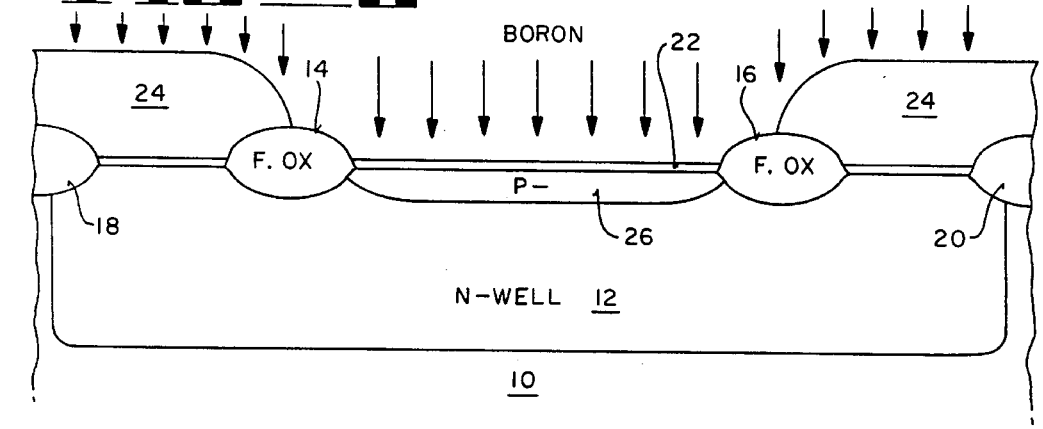
FIG_2
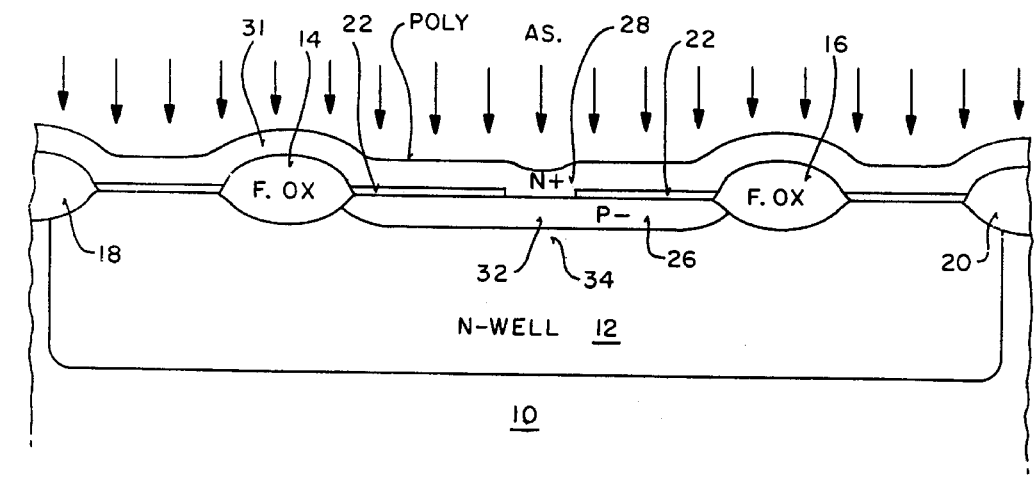
FIG_3

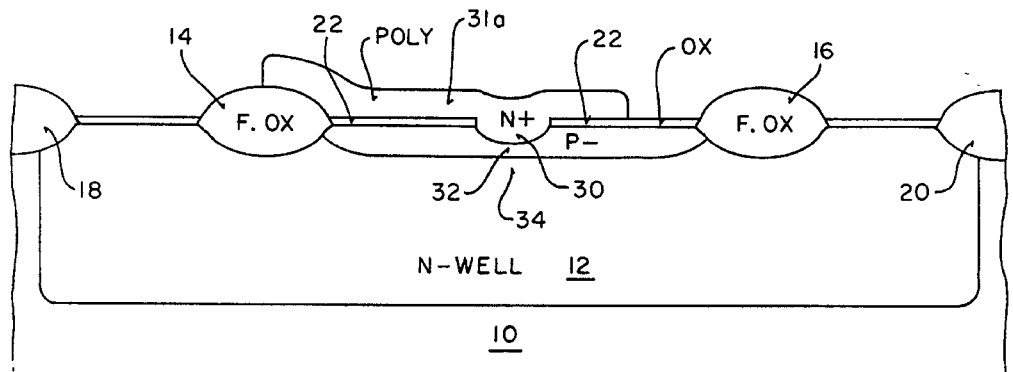
FIG_4
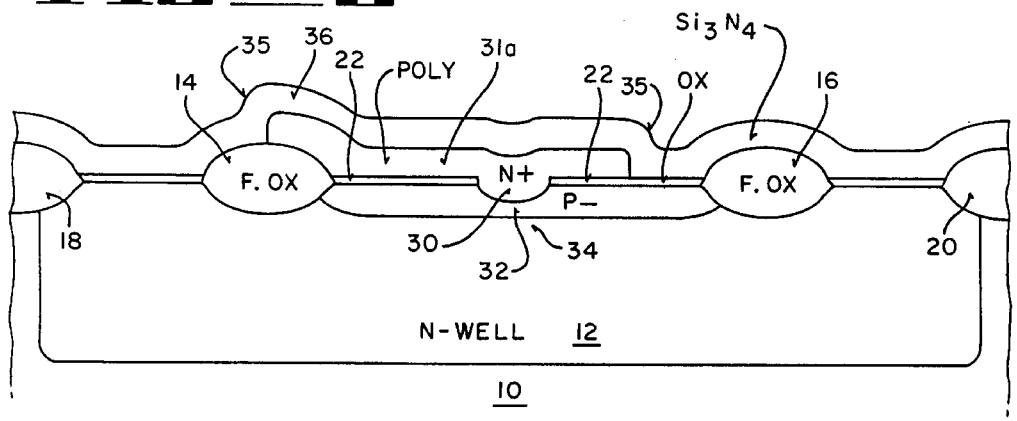
FIG_5
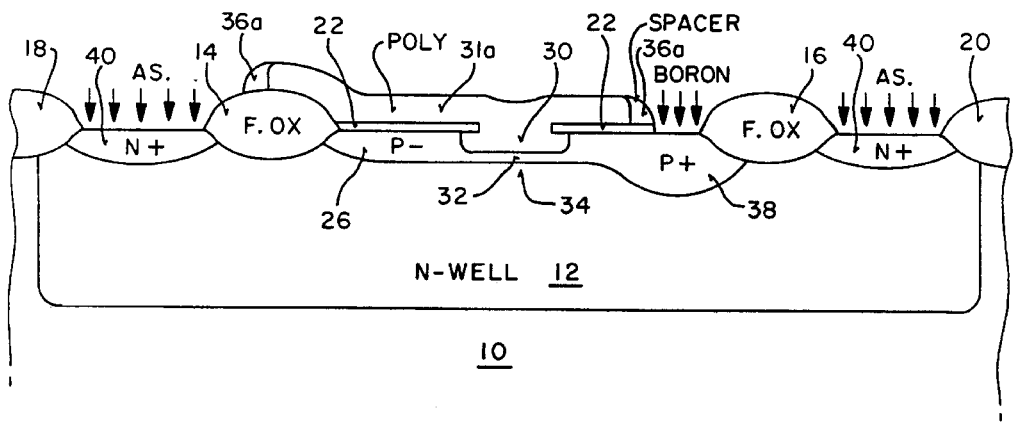
FIG_6

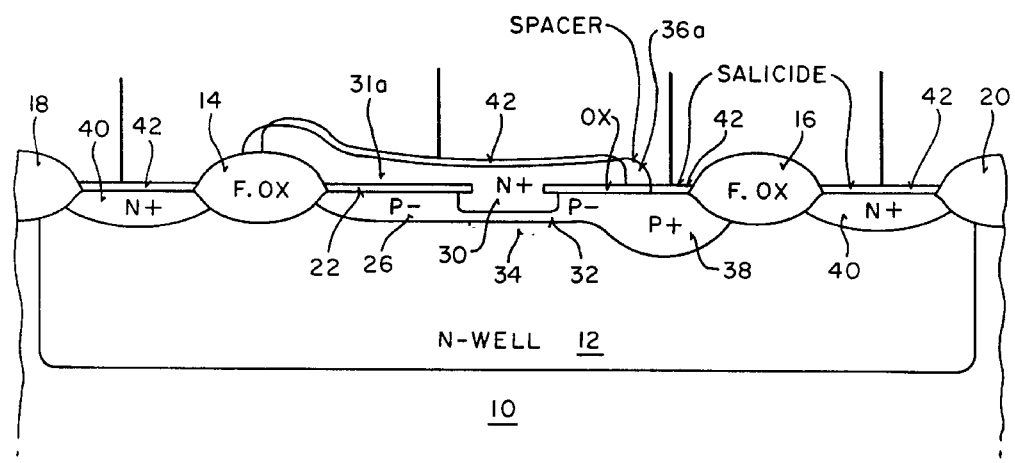
FIG_7
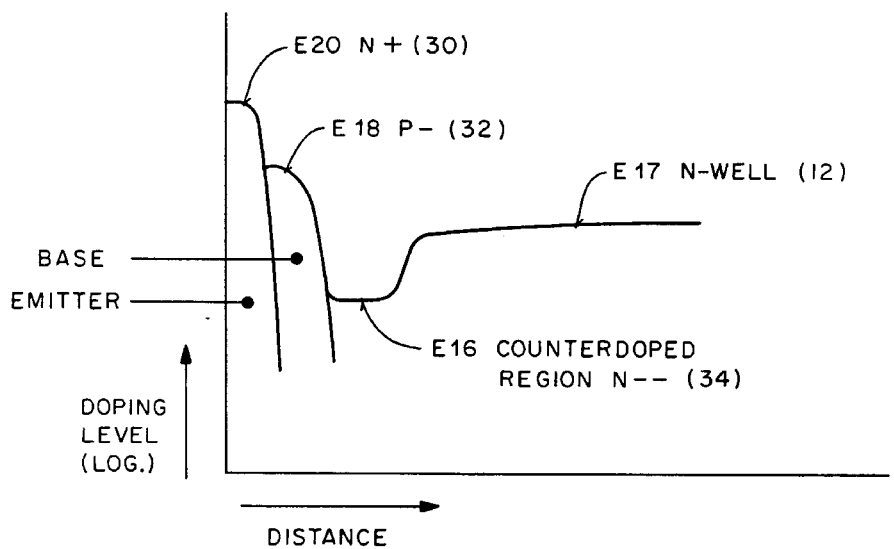
FIG_8

BICMOS PROCESS FOR COUNTER DOPED COLLECTOR

This is a continuation of application Ser. No. 07/881,309, filed May 7, 1992 now abandoned, which is a continuation of application Ser, No. 07/690,103, filed Apr. 23, 1991 now abandoned.

BACKGROUND OF THE INVENTION

1. Field of the Invention

The invention relates to the field of BiCMOS processing and, in particular, the formation of a collector region for a bipolar transistor formed as part of a BiCMOS process.

2. Prior Art

Some unique problems arise in the fabrication of bipolar transistors as part of metal-oxide-semiconductor (MOS) processing. One of these problems associated with the collector region of bipolar transistors is addressed in this application.

In the prior art, it is common to use a relatively low doped substrate region (e.g., 1E16-4E16) for the collector region and then to form the base region in the collector region and finally, to form the emitter region in the base region. If a highly doped collector region is used, the collector-base depletion region is narrow with a high electric field. This results in high speed electrons in an npn transistor that causes impact ionization. Holes generated by impact ionization due to this electric field cause a negative base current and a seemingly high gain. The corresponding problem occurs for pnp transistors.

In BiCMOS processing, it is common to use a heavily doped buried region to separate the bulk substrate from the more lightly doped collector region. Typically the collector region is formed in an epitaxial layer grown over the highly doped buried region.

As will be seen with the present invention, bipolar transistors are formed in a relatively highly doped well (1E17) which wells are also used as host regions for field-effect transistors. This eliminates the special processing needed to fabricate collector regions independently of the host regions for the field-effect transistors. The resultant collector region has relatively low resistance with reduced base to collector capacitance.

The following prior art is known to Applicant: U.S. Pat. Nos. 4,484,388; 4,602,269; 4,927,776; 4,933,295; 4,957,874; and 4,965,216.

SUMMARY OF THE INVENTION

In the fabrication of a BiCMOS integrated circuit where a bipolar transistor is formed in a substrate region of a first conductivity type, an improvement is described which permits the formation of a bipolar transistor in the substrate region (collector region) even though the substrate region is relatively highly doped. A base region is formed in the substrate region by implanting second conductivity type ions into the substrate region. At least two different energy levels are used to implant these ions. The lower energy level forms the major part of the base region. The higher of the energy levels implants the ions deeper into the substrate region so as to form a more lightly doped substrate region near the base region. Following this, an emitter region is formed in the base region.

In effect, counter doping is used in the collector region to reduce the active doping near the collector-base junction. This substantially reduces impact ionization while maintaining a low resistance collector region. Moreover, since more highly doped substrate regions are used for the collector regions, these regions are formed simultaneously with the formation of host regions for the field-effect transistors. This eliminates the need for any special processing for the collector regions.

BRIEF DESCRIPTION OF THE DRAWINGS

FIG. 1 is a cross sectional elevation view of a portion of a substrate illustrating a well, field oxide regions and silicon dioxide layer covering portions of the substrate.

FIG. 2 illustrates the substrate of FIG. 1 after a masking step and during an ion implantation step.

FIG. 3 illustrates the substrate of FIG. 2 after an additional masking and etching step, after the formation of a polysilicon layer and during an ion implantation step.

FIG. 4 illustrates the substrate of FIG. 3 after the polysilicon layer is pattered FIG. 5 illustrates the substrate of FIG. 4 after a silicon nitride layer is formed over the substrate.

FIG. 6 illustrates the substrate of FIG. 5 after the anisotropic etching of the silicon nitride layer used to form spacers.

FIG. 7 illustrates the substrate of FIG. 6 after salicide formation.

FIG. 8 is a graph illustrating the various doping levels for the transistor of FIG. 7.

DETAILED DESCRIPTION OF THE INVENTION

A process for forming a bipolar transistor as part of a BiCMOS process is described. More particularly, the invention is directed to a counter doped collector region. In the following description, numerous specific details are set forth, such as specific conductivity types, doping levels, etc. in order to provide a thorough understanding of the present invention. It will, however, be obvious to one skilled in the art that the present invention may be practiced without these details. In other instances, well-known processing such as cleaning steps, etc. are not described in order not to obscure the invention.

The following description describes the formation of an npn transistor in an n-well. It will be obvious to one skilled in the art that the present invention may be used where a pnp transistor is fabricated using the counter doping techniques of the present invention in a p-type well or substrate region.

In the cross sectional elevation view of FIG. 1, a portion of substrate 10 is illustrated which includes an n-type well 12. The region or well 12 is disposed generally between the field oxide regions 18 and 20. Two additional field oxide regions 14 and 16 are disposed between the regions 18 and 20. A silicon dioxide layer 22 covers the substrate.

In the currently preferred embodiment, the substrate comprises a monocrystalline silicon substrate; n-wells are formed during the "front end" process. Some of the n-wells are used as host regions for p-channel transistors, others of the wells (such as well 12 of FIG. 1) are used as collector regions for npn transistors. The n-wells are doped to a level of 1 E17 with phosphorus dopant. The field oxide regions are formed using well-known local oxidation processing; the silicon dioxide layer 22 is a grown layer with a thickness of approximately 250 Å.

The description below describes the steps used to form a bipolar transistor in the well 12. Some of these steps are also used for the fabrication of the field-effect transistors. Where steps are used only for bipolar transistor fabrication, thee portions of the substrate containing field-effect transistors are covered with photoresist to protect them. Those steps used solely for the fabrication of the field-effect transistors are not described in this application since they are well-known in the art and moreover, since the present invention may be used with any one of a plurality of well-known CMOS processes.

The portion of the substrate shown in FIG. 1 is a host region for a single npn transistor with the well 12 being used as the collector region for the transistor. In the currently preferred embodiment, prior to the steps shown in FIG. 2, a first layer of polysilicon and its related processing occurs in other parts of the substrate in connection with the formation of the field-effect transistors.

Referring to FIG. 2, the substrate of FIG. 1 is illustrated after a photoresist 24 has been patterned to expose the oxide layer 22 between the field oxide regions 14 and 16. In the currently preferred embodiment, three ion implantation steps are now used to form a base region and to counter dope the well 12 (collector region) as will be explained.

A relatively high dose of boron (2.5 E13) is used to form the region 26 at an energy level of 12 kev. Additionally, two other boron implants are used. One of these is at an energy level of 90 kev implant dose of 2 E12 and the second at 170 kev implant dose of 2 E12. These latter two implants are used to counter dope the n-well 12 close to the junction between the region 26 and the well 12. The grading of this junction will be described in conjunction with FIGS. 3 and 8. (The implant doses are in "per cm$^2$".)

Now as shown in FIG. 3, after the photoresist layer 24 is removed, an opening 28 is etched through the layer 22 using ordinary masking and etching techniques. Following this, the substrate is covered with a layer of polycrystalline silicon (polysilicon) to a thickness, in the currently preferred embodiment, of approximately 3000 Å. This layer is doped with an arsenic implant, as shown, an implant dose of 1 E16 at an energy level of 100 kev.

Commonly used annealing steps occur for the processing associated with the field-effect transistors causes the arsenic ions from the layer 31 to be diffused into the p-type region 26, thereby forming an emitter region 30. The resultant doping profiles after the various heating and annealing steps that occur during the entire processing is shown in FIG. 8. The emitter region 30 is doped with a peak doping level of approximately E20. Directly below region 30, the active base region 32 is doped to a level of E18. Immediately below the region 32, the original n-well 12 doping is counter doped with boron. Thus, directly below the base region, the counter doped region is doped to approximately E16 as shown in FIG. 8; the dopant level increases with distance from the emitter until it reaches the E17 level of the n-well, as shown in FIG. 8.

While in the currently preferred embodiment, two high energy boron implants are used and one relatively low energy implant, one high energy implant and one low energy implant may be used.

As shown in FIG. 4, the polysilicon layer 31 is etched to form the member 31a which extends from the field oxide region 14, over the region 30 to a point spaced-apart from the field oxide region 16. Ordinary photolithographic techniques are used to pattern this polysilicon layer.

Now the entire substrate is covered with a layer of silicon nitride 36 of approximately 2500 Å thick. The layer 36 is subject to an anisotropic silicon nitride plasma etch which substantially removes the layer except for spacers 36a adjacent to the polysilicon member 31a. This technique for forming spacers is known in the prior art. The spacers results from the anisotropic characteristics of the etchant and the steep slopes 35 formed alongside the members fabricated from the second layer of polysilicon. These spacers are formed on other polysilicon members on the substrate including those not associated with the bipolar transistors. (These spacers are typically used in the formation of field-effect devices to provide lightly doped drain regions).

At this point in the processing, a thin oxide region is grown on the second layer of polysilicon. This additionally helps to drive in the emitter dopant, therefore the region 30 in FIG. 6 is shown somewhat larger than the region 30 of FIG. 5.

When the source and drain regions for the n-channel field-effect transistors are implanted with arsenic, the portion of the n-well 12 between the field oxide regions 16 and 20 and between the field oxide regions 14 and 18 are left exposed to enable region 40 to be formed. As will be seen in FIG. 7, this region is a contact region for contacting the well/collector region. Similarly, when the source and drain regions for the p-channel field-effect transistors are implanted with boron, a portion of region 26 is left exposed allowing the boron ions to be implanted into region 38 forming a contact to the base region.

Finally as shown in FIG. 7, a salicide is formed over the diffusion in the field-effect transistors, over region 38 and 40, over polysilicon members 31a and over other polysilicon members. This allows better contact to be made to the base region and emitter region. Additionally, a contact is made to the polysilicon member 31a providing contact to the emitter region 30. Note the spacer 36a prevents the salicide on region 42 from contacting the member 31a.

Additionally, passivation processing and other "rear end" processing commonly used is not shown. This processing however, does not effect the present invention.

Thus, in summary at least two boron implants are used; a low energy level to generally form the region 26 and a high energy level, to form a more lightly doped n-type region 34 immediately below the intrinsic base region 26. This counter doping permits the remaining n-well 12 (collector region) to be more highly doped, hence providing a lower resistance collector. The counter doping provides a reduced electric field at the collector base junction thereby substantially reducing the problems associated with impact ionization. This additionally reduces the base-to-collector capacitance.

We claim:

1. In the fabrication of a BiCMOS integrated circuit where a bipolar transistor is formed in a substrate region of a first conductivity type, the improvement comprising the steps of:

forming a base region in said substrate region by implanting ions of a second conductivity type into said first conductivity type substrate region using at least two different energy levels, the lower energy level for implanting said second type conductivity ions into said substrate region so as to form an active base region, the higher energy level for implanting said second conductivity type ions deeper into said substrate region than the lower energy level implant so as to form a more lightly doped first conductivity type substrate region near said base region; and forming an emitter region in said base region over said more lightly doped first conductivity type substrate region.

2. The improvement defined by claim 1 wherein said formation of said emitter region comprises the step of forming a polysilicon layer over said base region and in contact with at least one portion of said base region, doping said polysilicon layer with a first conductivity type dopant so as to cause said first conductivity type dopant to diffuse into said base region to form said emitter region in said base region.

3. The improvement defined by claim 1 where two higher energy implants are used to form said more lightly doped first conductant type substrate region near said base region.

4. In the fabrication of a BiCMOS integrated circuit where an npn bipolar transistor is formed in an n-type substrate region, the improvement comprising the steps of:

forming a base region in said n-type region by implanting boron ions into said n-type region using at least two different energy levels, the lower of said energy levels for implanting said boron ions into said substrate so as to form an active base region, the higher of said energy levels for implanting said boron ions deeper into said n-type region than said boron ions of the lower energy level implant so as to form a more lightly doped n-type region near the junction of said n-type region and said base region; and forming an emitter region in said base region over said more lightly doped n-type region.

5. The improvement defined by claim 4 wherein said formation of said emitter region comprises the steps of forming a polysilicon layer over said base region and in contact with at least one portion of said base region, doping said polysilicon layer with an n-type dopant so as to cause said n-type dopant to diffuse into said base region to form said emitter region in said base region.

6. The improvement defined by claim 4 wherein two of said higher energy implants are used.

7. The improvement defined by claim 6 wherein said two higher energy implants occur at the energy levels of 90 kev and greater.

8. The improvement defined by claim 4, wherein the higher energy implant of boron is an approximately $2.0 \times 10^{12}/cm^2$ dose and the low energy implant of boron is an approximately $2.5 \times 10^{13}/cm^2$ dose.

9. The improvement defined by claim 6, wherein the two higher energy implants of boron are each an approximately $2.0 \times 10^{12}/cm^2$ dose and the low energy implant of boron is an approximately $2.5 \times 10^{13}/cm^2$ dose.

* * * * *